US012776772B2

(12) United States Patent
Kamath et al.

(10) Patent No.: US 12,776,772 B2
(45) Date of Patent: Oct. 27, 2026

(54) HALF-BRIDGE GaN DRIVER WITH INTEGRATED GaN FET

(71) Applicant: TEXAS INSTRUMENTS INCORPORATED, Dallas, TX (US)

(72) Inventors: Anant Kamath, Bangalore (IN); Taisuke Kazama, Plano, TX (US); Sombuddha Chakraborty, Redwood City, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 418 days.

(21) Appl. No.: 18/224,830

(22) Filed: Jul. 21, 2023

(65) Prior Publication Data

US 2025/0030413 A1 Jan. 23, 2025

(51) Int. Cl.
*H03K 17/687* (2006.01)
*H03K 17/06* (2006.01)

(52) U.S. Cl.
CPC ......... *H03K 17/687* (2013.01); *H03K 17/063* (2013.01); *H03K 2217/0063* (2013.01); *H03K 2217/0072* (2013.01)

(58) Field of Classification Search
CPC ............... H03K 17/063; H03K 17/687; H03K 2217/0063; H03K 2217/0072
USPC .......................................... 327/108, 109, 110
See application file for complete search history.

(56) References Cited

U.S. PATENT DOCUMENTS

| | | | | |
|---|---|---|---|---|
| 6,348,820 B1 * | 2/2002 | Bennett | H03K 17/063 | 327/388 |
| 2003/0141873 A1 * | 7/2003 | Bolz | G01R 31/006 | 324/380 |
| 2007/0290738 A1 * | 12/2007 | Wendt | H03K 17/0822 | 327/427 |
| 2016/0079975 A1 * | 3/2016 | Kinzer | H03K 17/687 | 327/109 |
| 2018/0309286 A1 * | 10/2018 | Kaundinya | H02H 9/04 | |

* cited by examiner

*Primary Examiner* — William Hernandez
(74) *Attorney, Agent, or Firm* — Charles F. Koch

(57) ABSTRACT

An integrated circuit is provided which comprises a transistor and a driver coupled to a gate of the transistor. In at least one example, the driver controls an operation of the transistor, wherein the driver is operable in a first configuration as a low-side gate driver for a voltage regulator, and wherein the transistor is operable in the first configuration as a low-side switch for the voltage regulator. In at least one example, the driver is operable in a second configuration as a high-side gate driver for the voltage regulator, and wherein the transistor is operable in the second configuration as a high-side switch for the voltage regulator.

23 Claims, 7 Drawing Sheets

HALF-BRIDGE GaN DRIVER WITH INTEGRATED GaN FET

CROSS-REFERENCE TO RELATED APPLICATIONS

This application claims the benefit of and priority of Indian Foreign Filing Patent Application No. FA/2513/CHE/2023, filed on Jun. 23, 2023, issued on Jul. 6, 2023, titled "GaN Single Channel Power-Stage with High-Side Level Shifting and Boot Switch," which is hereby fully incorporated herein by reference.

BACKGROUND

Gallium nitride (GaN) is a semiconductor material formed from elements belonging to Group III and Group V of the periodic table. Field effect transistors (FET) based on GaN are used in high power circuits such as radio frequency (RF) circuits, power systems, and the like.

BRIEF DESCRIPTION OF DRAWINGS

The examples will be understood more fully from the detailed description given below and from the accompanying drawings, which, however, should not be taken to limit the disclosure to the specific examples, but are for explanation and understanding only.

SUMMARY

Figure 1:
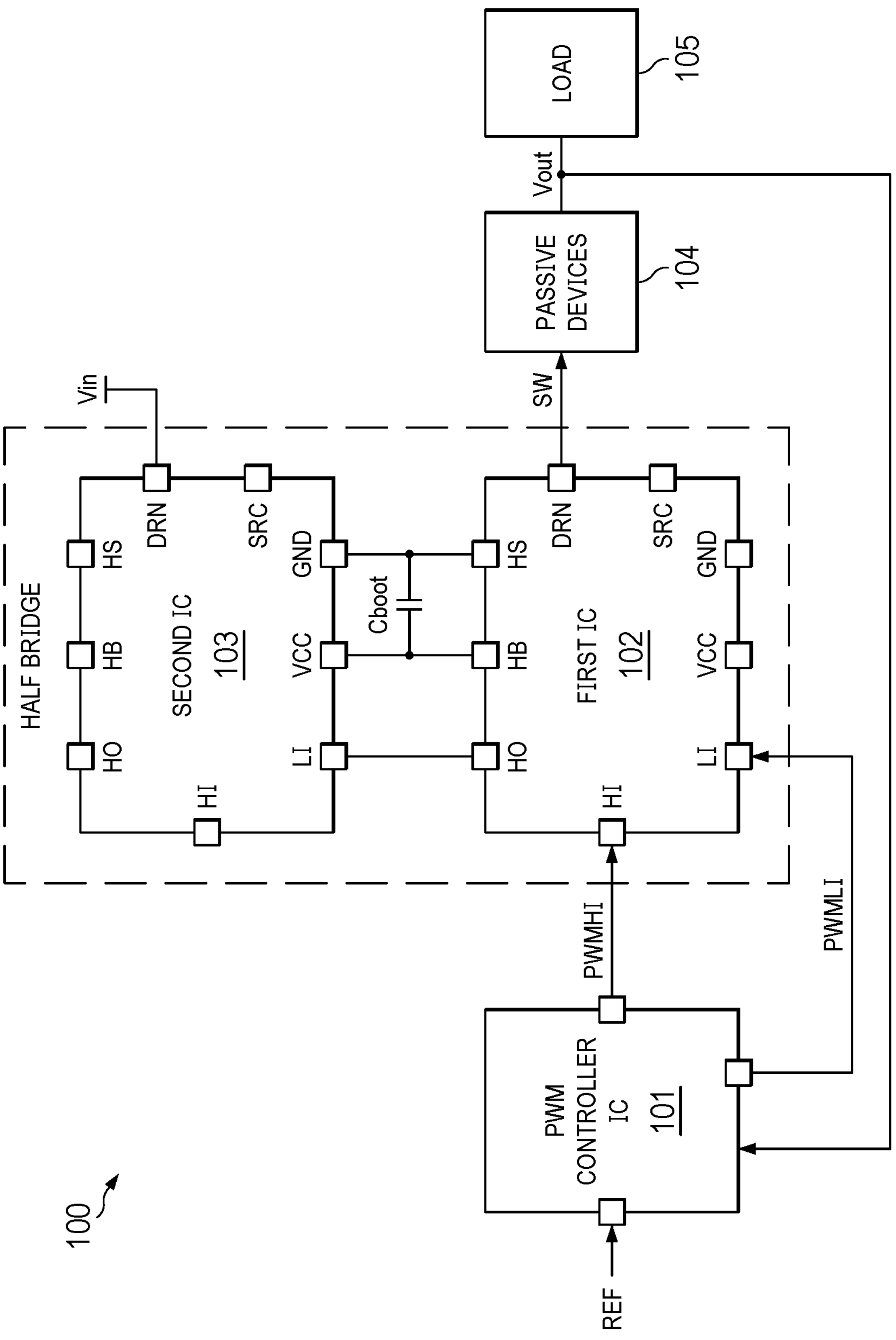
FIG. 1 illustrates a high-level system with integrated circuits for a half-bridge driver, according to at least one example.

In at least one example, an integrated circuit is provided which comprises a transistor. In at least one example, the transistor comprises Gallium (Ga) and Nitrogen (N). In at least one example, the integrated circuit further comprises a driver coupled to a gate of the transistor. In at least one example, the driver controls an operation of the transistor. In at least one example, the driver is operable in a first configuration as a low-side gate driver for a voltage regulator. In at least one example, the transistor is operable in the first configuration as a low-side switch for the voltage regulator. In at least one example, the driver is operable in a second configuration as a high-side gate driver for the voltage regulator. In at least one example, the transistor is operable in the second configuration as a high-side switch for the voltage regulator. In at least one example, the configurable integrated circuit performs a function of a half-bridge driver without an external level-shifter or boot-strap circuit.

In at least one example, a voltage regulator system is provided which comprises a controller circuitry to generate a pulse width modulated signal. In at least one example, the system comprises a first integrated circuit coupled to the controller circuitry, wherein the first integrated circuit receives the pulse width modulated signal. In at least one example, the system comprises a second integrated circuit coupled to the first integrated circuit. In at least one example, the system comprises an inductor coupled to the first integrated circuit, and a capacitor coupled to the inductor. In at least one example, the system comprises a load (e.g., server, telecommunication power unit, solar inverter, motor drivers, etc.) coupled to the capacitor and the inductor. In at least one example, the first integrated circuit comprises a first transistor including GaN. In at least one example, the first integrated circuit comprises a first driver that drives the first transistor in accordance with the pulse width modulated signal. In at least one example, the second integrated circuit comprises a second transistor including GaN. In at least one example, the second integrated circuit comprises a second driver that receives a level-shifted signal from the first integrated circuit.

In at least one example, a method is provided which comprises receiving a first pulse modulated signal and driving the first pulse modulated signal to a first GaN transistor of a first die. In at least one example, the method comprises receiving a second pulse modulated signal. In at least one example, the method comprises level-shifting the second pulse modulated signal to generate a level-shifted second pulse modulated signal. In at least one example, the method comprises providing the level-shifted second pulse modulated signal to a second driver of a second die. In at least one example, the method further comprises providing a boot-strap supply from the first die to the second die to power the second driver, wherein the second driver is to drive a second GaN transistor.

DETAILED DESCRIPTION

Disclosed herein are one or more mechanisms to improve performance of a half-bridge driver comprising GaN FETs. In at least one example, a GaN FET is integrated with its driver in a packaged integrated circuit (IC). In at least one example, a package IC is operable as a low-side device of a half-bridge driver which is coupled to a reference low supply (e.g., ground). In at least one example, a package IC is operable as a high-side device of a half-bridge driver which is coupled to an input supply (e.g., Vin). In at least one example, a level-shifter and a boot-strap device (e.g., a diode or a transistor) are integrated into a packaged IC. In at least one example, a level-shifter and a boot-strap device are disabled or unused when a packaged IC is configured as a high-side device. In at least one example, a level-shifter and a boot-strap device of a packaged IC, configured as a low-side device, are used to provide a level-shifted signal (e.g., a level-shifted pulse modulated signal) and a boot-strap power supply to a driver of a packaged IC which is configured as a high-side device. In at least one example, signal and supply pins of a first instance of a packaged IC (e.g., first IC) are positioned to allow another instance of a packaged IC (e.g., second IC) to be placed directly adjacent to the first instance of the packaged IC to form a half-bridge driver with minimal routing space for signal and supply lines from the signal and supply pins, respectively. In at least one example, signal and supply pins of a first instance of a packaged IC (e.g., first IC) are positioned to allow another instance of a packaged IC (e.g., second IC) to be concatenated with the first instance of the packaged IC to form a half-bridge driver.

In at least one example, a low-side package IC, which is also configurable as a high-side package IC, when connected to form a half-bridge driver, results in lower gate and common source inductances compared to a single packaged half-bridge driver IC. In at least one example, a low-side package IC which is also configurable as a high-side package IC, when connected to form a half-bridge driver, results in lower switching node parasitics because a full high-side gate driver, pre-driver, and high-side GaN FET are not integrated in one IC along with a low-side gate driver, pre-driver, and low-side GaN FET. In at least one example, common source inductance and gate loop inductance limits are reduced when both packaged ICs are concatenated to form a half-bridge driver. In at least one example, a low-side package IC which is also configurable as a high-side package IC, when connected to form a half-bridge driver, result in higher power delivery compared to the same sized GaN FET based fully integrated half-bridge driver power stage because of lower power losses from parasitic inductances. Other technical effects will be evident from various examples described herein.

FIG. 1 illustrates system 100 with integrated circuits to form a half-bridge driver, according to at least one example. In at least one example, system 100 includes a pulse width modulation (PWM) controller IC 101, first IC 102, second IC 103, boot capacitor Cboot, passive device 104, and load 105. In at least one example, first IC 102 and second IC 103 together form a half-bridge driver.

In at least one example, PWM controller IC 101 receives a reference Ref (e.g., a voltage reference) and compares a voltage on an output supply line Vout with reference Ref. Here, signal names and node names are interchangeably used. For example, Vout may refer to voltage Vout or supply rail or node Vout depending on context of a sentence. In at least one example, based on whether voltage on output supply line Vout is higher or lower than reference Ref, PWM controller IC 101 generates outputs PWMHI and PWMLI with pulse widths that vary according to difference between the voltage on output supply line Vout and reference Ref.

In at least one example, outputs PWMHI and PWMLI are complementary signals. For example, when output PWMHI is high, output PWMLI is low. In at least one example, PWM controller IC 101 establishes dead time between outputs PWMHI and PWMLI. For example, between a time when PWMHI signal goes high and when PWMLI goes low, PWM controller IC 101 introduces a dead-time (e.g., break-before-make time) to avoid a situation where both outputs PWMHI and PWMLI have same logic value (e.g., both are logic high, or both are logic low). In at least one example, PWM controller IC 101 establishes dead time to avoid a short circuit caused by GaN FETs when first IC 102 and second IC 103 are turned on at a same time. In at least one example, dead time is a programmable time (e.g., programmable by software, hardware, or a combination of them). In at least one example, first IC 102 receives PWMLI to drive a low-side GaN FET and level-shifts PWMHI by a level-shifter for generating an input for second IC 103. In at least one example, system 100 controls Vout to a target level by controlling outputs PWMHI and PWMLI. In at least one example, PWM controller IC 101 modifies pulse widths of outputs PWMHI and PWMLI to raise or lower Vout (e.g., control Vout) to a target level which corresponds to reference Ref. In at least one example, PWM controller IC 101 modifies frequency of outputs PWMHI and PWMLI to raise or lower Vout (e.g., control Vout) to a target level.

In at least one example, first IC 102 includes pins HI, LI, VCC, GND, HO, HB, HS, DRN, and SRC. In at least one example, pins HI and LI of first IC 102 are input pins that receive PWM signals PWMHI and PWMLI, respectively. In at least one example, pin HO of first IC 102 is an output pin that provides level-shifted PWMHI signal to second IC 103. In at least one example, pins VCC and GND of first IC 102 are supply pins that receive power supply and ground, respectively. In at least one example, pin HB of first IC 102 is a boot-strap supply pin that provides a boot-strap supply for driver of second IC 103, which is configured as a high-side switch. In at least one example, pin HS of first IC 102 is a switching node which is a common node of GaN FET of first IC 102 and GaN FET of second IC 103. In at least one example, pin DRN is connected to a drain terminal of a GaN FET of first IC 102. In at least one example, pin SRC is connected to a source terminal of GaN FET of first IC 102.

Here, a GaN FET refers to a field effect transistor comprising Ga and N. GaN FETs can be configured in depletion mode where a GaN FET is normally on, and a negative voltage relative to a drain and source terminal is applied to a gate terminal to turn the GaN FET off. GaN FETs can be configured in enhancement mode where a GaN FET is normally off, and a positive voltage relative to a drain and source terminal is applied to a gate terminal to turn the GaN FET on. While various examples here are described with reference to an enhancement mode GaN FET, the half-bridge driver architecture of at least one example can be reconfigured to operate with a depletion mode GaN FET.

In at least one example, second IC 103 includes pins HI, LI, VCC, GND, HO, HB, HS, DRN, and SRC. In at least one example, second IC 103 is an instance or copy of first IC 102. In at least one example, pins of second IC 103 are repurposed to configure second IC 103 as a high-side driver and switch for a half-bridge driver. In at least one example, pins HI and HO of second IC 103 are set to a fixed value (e.g., grounded). In at least one example, pins HB and HS are floating or coupled to a capacitor. In at least one example, level-shifter and boot-strap diode or transistor of second IC 103 are not used since level-shifted PWM signal and boot-strap power supply is provided by first IC 102. In at least one example, pin LI of second IC 103 is connected to pin HO of first IC 102. In at least one example, pin VCC of second IC 103 is connected to pin HB of first IC 102. In at least one example, pin GND of second IC 103 is connected to pin HS of first IC 102. In at least one example, pin DRN of second IC is coupled to an input power supply Vin. In at least one example, pin SRC of second IC 103 is connected to GND pin of second IC 103. In at least one example, pin DRN is connected to drain terminal of a GaN FET of second IC 103. In at least one example, pin SRC is connected to source terminal of GaN FET of second IC 103.

In at least one example, pin DRN of first IC 102 is coupled to passive devices 104 via switching node SW. In at least one example, passive devices include an inductor, a capacitor, and/or a resistor. In at least one example, a filtered output from passive devices 104 is a regulated power supply Vout which is provided to load 105. In at least one example, load 105 is any suitable load such as a server, a telecommunication power unit, solar cells, class D audio units, test and measurement units, motor drives in electric vehicles, etc. In at least one example, system 100 is used in a DC-DC converter (e.g., 48V DC-DC converter), solar inverter, test and measurement power supplies, DC sources, etc.

In at least one example, first IC 102 is packaged as an independent die with a heat sink (not shown). In at least one example, second IC 102 is packaged as an independent die with a heat sink. In at least one example, a heat sink is over an area that covers GaN FET to provide heat transfer from GaN FET (e.g., 6.5 mm×4.0 mm). In at least one example, a heat sink is positioned over an entire top surface of first IC 102.

In at least one example, first IC 102 and second IC 103 have same dimensions or footprint on a printed circuit board (e.g., first IC 102 and second IC 103 have same length, width, height, area, perimeter, shape, and pin locations). In at least one example, first IC 102 and second IC 103 have a GaN FET and associated driver, and depending on pin configurations, first IC 102 and second IC 103 may be connected as a half-bridge driver. In at least one example, first IC 102 and second IC 103 together are configured as a buck converter. In at least one example, first IC 102 and second IC 103 together are configured as a boost converter. In at least one example, multiple sets of first IC 102 and second IC 103 may be coupled to individual inductors to form a multi-phase DC-DC converter.

Figure 2:
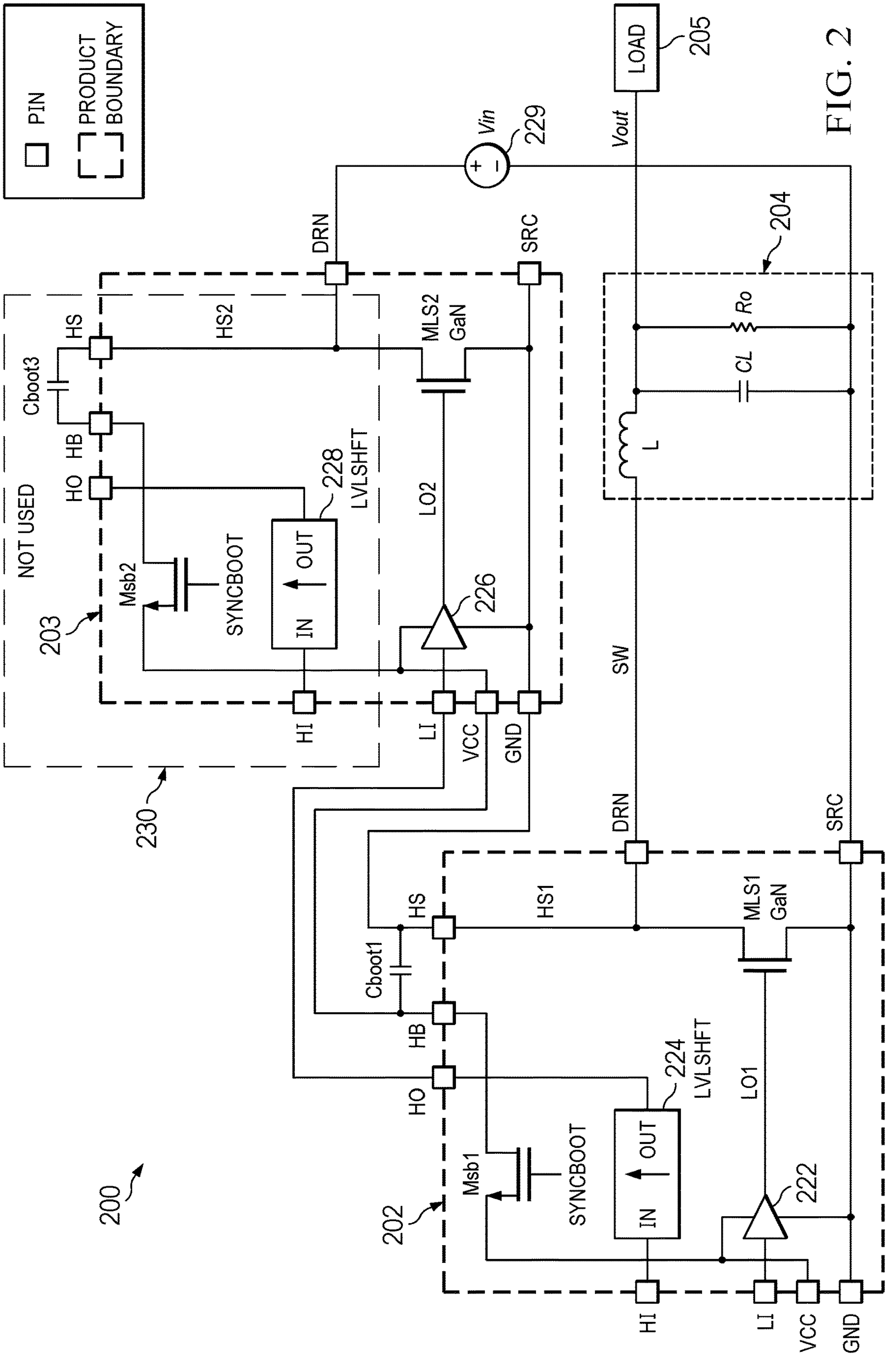
FIG. 2 illustrates a circuit-level system with integrated circuits for a half-bridge driver, according to at least one example.

FIG. 2 illustrates circuit-level system 200 with integrated circuits that form a half-bridge driver, according to at least one example. In at least one example, pin names and connections are same as those described with reference to system 100. In at least one example, system 200 comprises first IC 202, second IC 203, passive devices 204, and load 205. In at least one example, first IC 202 comprises FET driver 222, level-shifter (LVLSHFT) 224, GaN FET MLS1 (e.g., low-side switch), and boot-strap transistor MSb. In at least one example, second IC 203 comprises FET driver 226, level-shifter (LVLSHFT) 228, GaN FET MLS2 (high-side switch), and boot-strap transistor MSb2.

In at least one example, a low-side gate driver and a low-side GaN FET switch is configured as a high-side gate driver and a high-side GaN FET switch in a half-bridge driver configuration. Since a low-side gate driver and a low-side GaN FET are repurposed as a high-side gate driver and a high-side GaN FET switch, an isolated well or tank is not used, which results in savings in parasitic capacitance. In at least one example, first IC 202 generates a boot-strap voltage and provides it as a power supply to driver 226 of second IC 203.

In at least one example, a power rail which is connected to pin VCC powers driver 222. In at least one example, driver 222 has a reference low terminal coupled to pin GND (e.g., ground). In at least one example, driver 222 comprises complementary metal oxide semiconductor (CMOS) based transistors that drive node LO1 which is coupled to a gate terminal of GaN FET MLS1. In at least one example, driver 222 includes a pre-driver. Any suitable driver circuitry can be used to drive GaN FET MLS1 so that it can be turned on or off based on the PWMLI signal (e.g., pulse train) received on pin LI. In at least one example, software, firmware, hardware, or a combination of them adjusts drive strength of driver 222 to control rise and fall times of the signal on node LO1.

In at least one example, level-shifter 224 receives the PWMHI signal on pin HI. In at least one example, a PWM controller generates the PWMHI signal and the PWMLI signal. In at least one example, level-shifter 224 level-shifts the PWMHI signal from a lower power supply voltage level to a higher power supply voltage level. In at least one example, level-shifter 224 drives an output to pin HO, where pin HO is coupled to an input of a driver of second IC 203.

In at least one example, boot-strap transistor Msb1 of first IC 202 is coupled to pin VCC and pin HB. In at least one example, synchronizing signal SYNCBOOT couples to a gate terminal of boot-strap transistor Msb1 and controls on and off behavior of boot-strap transistor Msb1. In at least one example, synchronizing signal SYNCBOOT turns on boot-strap transistor Msb1 to charge a boot capacitor Cboot1, which is coupled to pin HB and pin HS. In at least one example, boot capacitor Cboot1 is a discrete capacitor. In at least one example, synchronizing signal SYNCBOOT turns on boot-strap transistor Msb1 based on an ON condition of GaN FET MLS1 and OFF condition of GaN FET MLS2 to charge capacitor Cboot1. While boot-strap transistor Msb1 is illustrated as an n-channel transistor, a p-channel transistor may be used instead, in at least one example.

In at least one example, synchronizing signal SYNCBOOT turns off boot-strap transistor Msb1 based on an OFF condition of GaN FET MLS1 and an ON condition of GaN FET MLS2. In at least one example, charge developed on capacitor Cboot1 powers driver 226 of GaN FET MLS2. In at least one example, capacitance of boot capacitor Cboot1 is larger than the sum of the gate capacitance of GaN FET MLS1 of first IC 202 and the gate capacitance of GaN FET MLS2 of second IC 203. In at least one example, first IC 202 includes logic for generating synchronizing signal SYNCBOOT. In at least one example, logic for generating synchronizing signal SYNCBOOT is off die (e.g., outside of first IC 202).

In at least one example, second IC 203 is concatenated with first IC 202 to form a high-side switch of half-bridge driver, where first IC 202 operates as a low-side switch of the half-bridge driver. In at least one example, second IC 203 is an instance of first IC 202 in that a copy or instance of first IC 202 is used for second IC 203 but with different pin settings or configuration. In at least one example, a power rail, which is connected to pin VCC, powers driver 226 of second IC 203. In at least one example, the power rail, which is connected to pin VCC, is connected to boot-strap supply supplied by pin HB of first IC 202. In at least one example, driver 226 has a reference low terminal coupled to pin GND, which in turn is connected to pin HS of first IC 202.

In at least one example, driver 226 comprises complementary metal oxide semiconductor (CMOS) based transistors that drive node LO2 which is coupled to a gate terminal of GaN FET MLS2. In at least one example, driver 226 includes a pre-driver. Any suitable driver circuitry can be used to drive GaN FET MLS2 so that it can be turned on or off based on level-shifted PWMHI signal (e.g., pulse train) received on pin LI, which in turn is connected to pin HO of first IC 202. In at least one example, GaN FET MLS2 couples to an input power supply Vin 229. In at least one example, software, firmware, hardware, or a combination of them adjust drive strength of driver 226 to control rise and/or fall times of the signal on node LO2.

In at least one example, second IC 203 includes level-shifter 228 and boot-strap transistor Msb2, but they are functionally not operable when second IC 203 is being used as high-side switch of a half-bridge driver (e.g., circuits identified by dashed region 230 may not be operable). In at least one embodiment, input to level-shifter 228 is connected to input pin HI, which may be ground externally or connected to a fixed supply, or unconnected. In at least one example, output pin HO of level-shifter 228 is not used and may be connected to ground, a fixed supply, or unconnected.

In at least one example, a boot capacitor Cboot3 is connected to pin HB and pin HS of second IC 203. In at least one example, no device is connected between pin HB and pin HS of second IC 203. In at least one example, pin HB and pin HS of second IC 203 are shorted and boot-strap transistor Msb2 is turned off by SYNCHOOT signal.

In at least one example, source terminal of GaN FET MLS2 is connected to pin GND (and pin SRC) of second IC 203. In at least one example, pin GND of second IC 203 is connected to pin HS of first IC 202. In at least one example, pin HS of first IC 202 connects to node HS1 which connects to the drain terminal of GaN FET MLS1 of first IC 202.

In at least one example, GaN FET MLS1 and GaN GET MLS2 have identical sizes. In at least one example, GaN FET MLS1 has a size different from a size of GaN FET. In at least one example, GaN FET MLS2 is larger than GaN FET MLS1 while maintaining the same size, shape, height, and pin locations of second IC 203 as first IC 202. In at least one example, when larger GaN FET MLS2 is used compared to GaN FET MLS1, software, hardware, or a combination of them can adjust drive strength of driver 226 to drive larger GaN FET MLS2.

In at least one example, drain terminal of GaN FET MLS1 is connected to pin DRN which in turn is connected to passive devices 204 via switching node SW. In at least one example, passive devices 204 comprise an inductor L, load capacitor CL, and resistor Ro. In at least one example, a first terminal of inductor L is connected to switching node SW, and a second terminal of inductor is connected to output supply rail Vout. In at least one example, load capacitor CL is connected to second terminal of inductor L and ground. In at least one example, resistor Ro is connected to second terminal of inductor L and ground.

In at least one example, inductor L is an air core inductor, toroidal inductor, laminated core inductor, powdered iron core inductor, axial inductor, shielded surface mount inductor, coupled inductor, multilayer chip inductor, shielded variable inductor, molded inductor, or ceramic core inductor. In at least one example, a substrate includes within it, inductor L. In at least one example, an interposer includes within it, inductor L. In at least one example, capacitor CL is one of a ceramic capacitor, film capacitor, power film capacitor, electrolytic capacitor, transistor configured as a capacitor, ferroelectric capacitor, metal-insulator-metal (MIM) capacitor, an on-die capacitor, or an off-die capacitor. In at least one example, resistor Ro is a discrete resistor or a transistor configured as a resistor.

In at least one example, output supply rail Vout is connected to load 205 and provides load 205 with a regulated power supply. In at least one example, load 205 is any suitable load including a server, a telecommunication power unit, solar cells, class D audio units, test and measurement units, motor drives in electric vehicles, etc.

Figure 3:
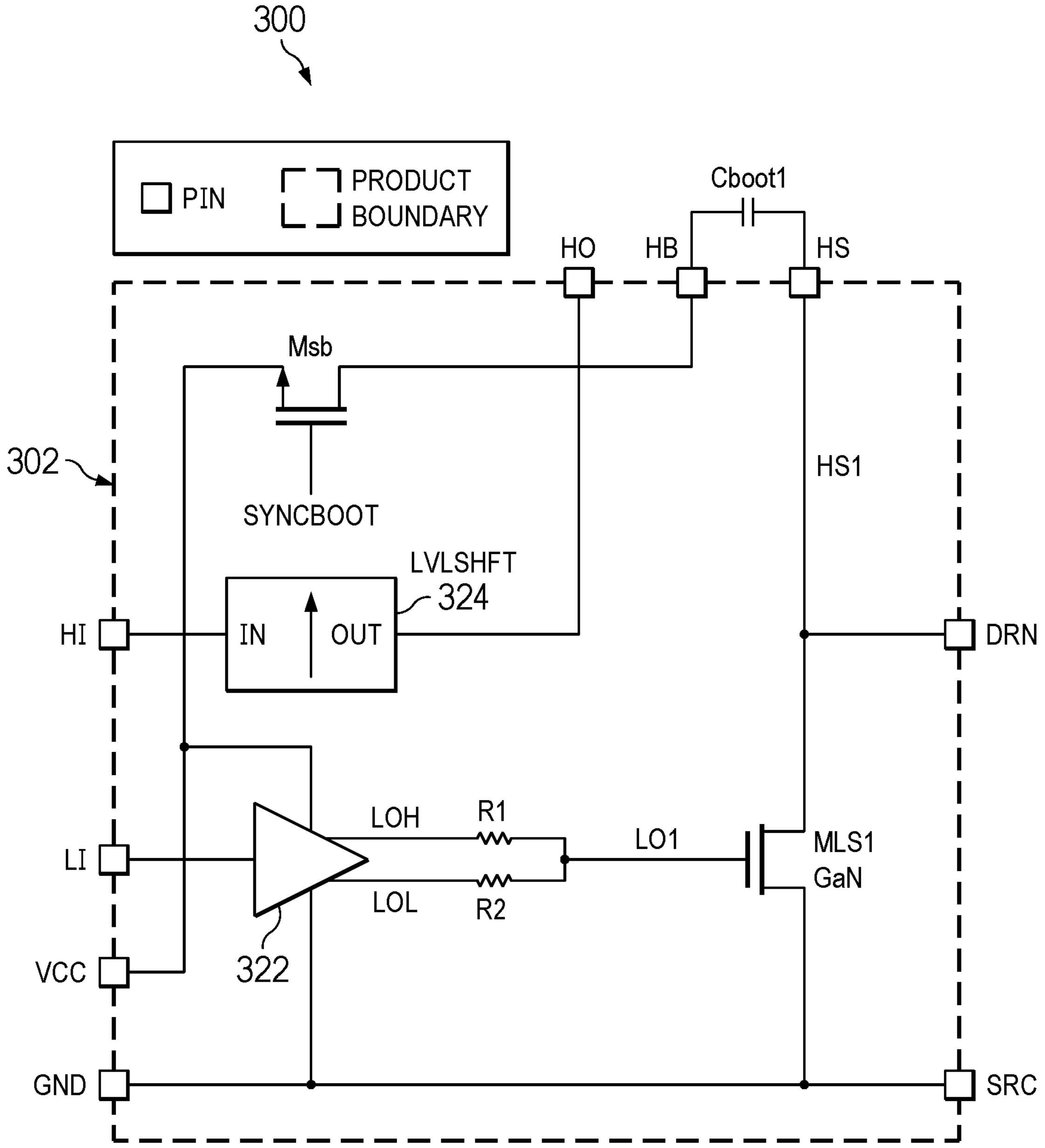
FIG. 3 illustrates an integrated circuit with separate turn-on and turn-off paths for a GaN FET, according to at least one example.

FIG. 3 illustrates apparatus 300 with separate turn-ON and turn-OFF paths for a GaN FET, according to at least one example. In at least one example, apparatus 300 includes IC 302 and boot capacitor Cboot1. In at least one example, IC 302 is one part of a half-bridge driver and can be configured as a low-side switch or a high-side switch. In at least one example, IC 302 comprises FET driver 322, level-shifter (LVLSHFT) 324, GaN FET MLS1 (e.g., low-side switch), boot-strap transistor MSb, resistor R1, and resistor R2. In at least one example, driver 322 is similar to driver 222 but for two outputs LOH and LOL. In at least one example, driver 322 generates two outputs LOH and LOL to control turning ON and OFF of GaN FET MLS1. In at least one example, driver 322 generates output LOL to fully turn OFF GaN FET MLS1. In at least one example, driver 322 generates output LOH to fully turn ON GaN FET MLS1. In at least one example, resistors R1 and R2 have equal resistance values. In at least one example, resistors R1 and R2 have different resistance values to turn ON or OFF GaN FET MLS1 at different speeds. In at least one example, a common terminal of resistors R1 and R2 are coupled to node LO1, which is connected to gate terminal of GaN FET MLS1.

In at least one example, driver 322 is powered by a power rail which is connected to pin VCC. In at least one example, driver 322 has a reference low terminal coupled to pin GND (e.g., ground). In at least one example, driver 322 comprises complementary metal oxide semiconductor (CMOS) based transistors that drive gate terminal of GaN FET MLS1. In at least one example, driver 322 includes a pre-driver. Any suitable driver circuitry can be used to drive GaN FET MLS1 so that it can be turned ON or OFF based on the PWMLI signal (e.g., pulse train) received on pin LI. In at least one example, software, hardware, firmware, or a combination of them adjusts drive strength of driver 322 to control rise and fall times of signals on nodes LOH and LOL.

In at least one example, level-shifter 324 receives the PWMHI signal (e.g., pulse train) on pin HI. In at least one example, a PWM controller generates the PWMHI signal or pulse train. In at least one example, level-shifter 324 level-shifts PWMHI signal from a lower power supply voltage level to a higher power supply voltage level. In at least one example, HO pin receives output of level-shifter 324. In at least one example, an input of a driver of another IC similar or identical to IC 302 receives output of level-shifter 324 via pin HO.

In at least one example, boot-strap transistor Msb1 couples to pin VCC and pin HB. In at least one example, a synchronizing signal SYNCHOOT controls ON and OFF behavior of boot-strap transistor. In at least one example, synchronizing signal SYNCBOOT turns ON boot-strap transistor Msb1 to charge a boot capacitor Cboot1, which is coupled to pin HB and pin HS. In at least one example, synchronizing signal SYNCBOOT operates similar to signal SYNCBOOT discussed with reference to FIG. 2.

Figure 4:
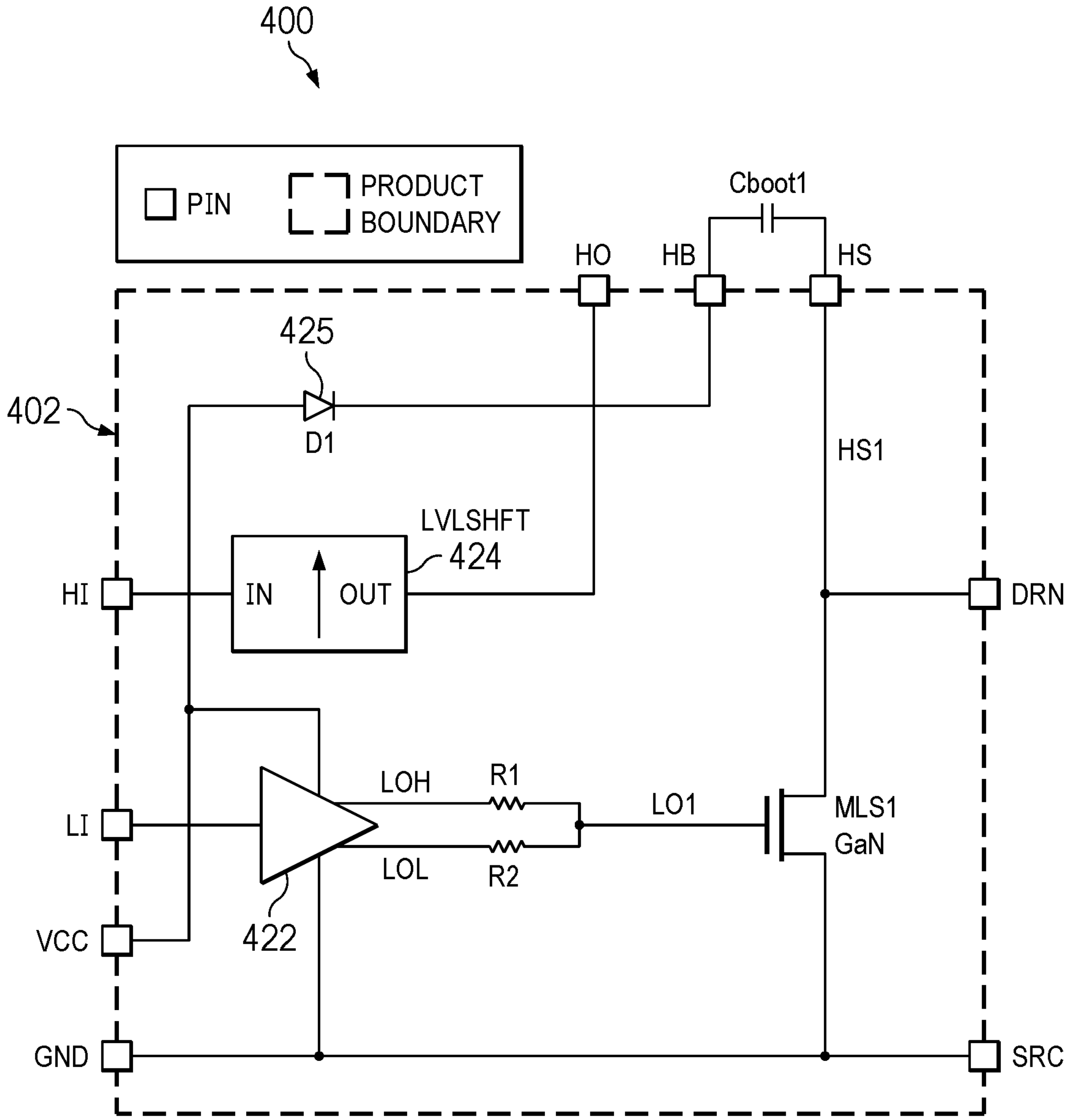
FIG. 4 illustrates an integrated circuit with separate turn-on and turn-off paths for a GaN FET, and a diode as boot-strap circuitry, according to at least one example.

FIG. 4 illustrates apparatus 400 with separate turn-ON and turn-OFF paths for a GaN FET, and a diode as boot-strap circuitry, according to at least one example. Here, apparatus 400 is one part of a half-bridge driver and can be configured as a low-side switch or a high-side switch, in accordance with at least one example. In at least one example, apparatus 400 comprises IC 402 and boot capacitor Cboot1. In at least one example, IC 402 comprises FET driver 422, level-shifter (LVLSHFT) 424, GaN FET MLS1 (e.g., low-side switch), boot-strap diode D1 425, resistor R1, and resistor R2. In at least one example, driver 422 is similar to driver 322. In at least one example, level-shifter 424 is similar to level-shifter 324. In at least one example, boot-strap transistor Msb is replaced with diode D1 425.

In at least one example, IC 402 is a first IC, and another similar or identical IC such as second IC 203 is concatenated with IC 402 to form a half-bridge driver. Operation of diode D1 can be understood when both IC 402 and similar IC (e.g., second IC 203) are concatenated as shown in FIG. 2. In at least one example, diode D1 is forward biased when GaN FET MLS1 is turned ON and GaN FET MLS2 of second IC 203 is turned OFF to charge capacitor Cboot1. In at least one example, diode D1 is reverse biased when GaN FET MLS is turned OFF and GaN FET MLS2 of a second IC 203 is ON. In at least one example, charge developed on capacitor Cboot1 powers driver 226 of GaN FET MLS2 of second IC 203.

Figure 5:
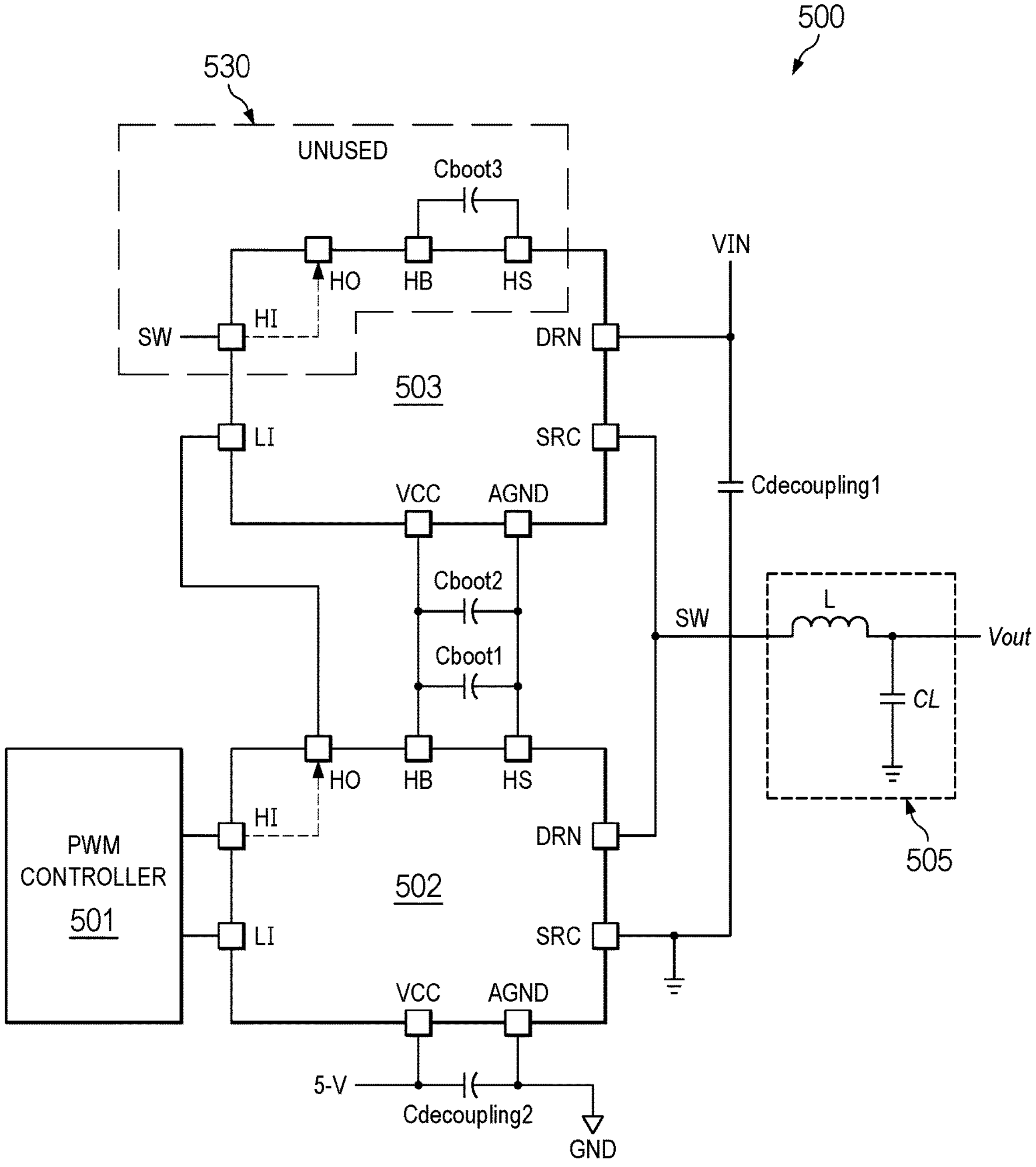
FIG. 5 illustrates a high-level system with layout of integrated circuits for a half-bridge driver on a printed circuitry board, according to at least one example.

FIG. 5 illustrates high-level system 500 with layout of half-bridge driver integrated circuits on a printed circuitry board, according to at least one example. In at least one example, system 500 comprises PWM controller 501, first IC 502, second IC 503, and passive devices 505. In at least one example, system 500 illustrates concatenation of first IC 502 (e.g., IC 202, IC 302, or IC 402) and second IC 503 (e.g., IC 302, IC 302, or IC 402) to form a half bridge. In at least one example, PWM controller 501 (e.g., same as PWM controller IC 101) provides PWMHI and PWMLI signals to pins HI and LI of first IC 502, respectively, where first IC 502 has same pin orientation and position as second IC 503. In at least one example, pin locations of first IC 502 are arranged or selected to reduce wire routing between pins of first IC 502 and second IC 503. In at least one example, first IC 502 and second IC 503 have identical footprint in that they have identical size, shape, height, and pin locations.

Various pins of first IC 502 and second IC 503 are connected as discussed with reference to first IC 202 and second IC 203 of FIG. 2. In at least one example, a decoupling capacitor Cdecoupling1 connects to pin DRN of second IC 503 and pin SRC of first IC 502 to filter sudden noise (e.g., voltage droop) on input supply rail VIN. In at least one example, one or more boot capacitors Cboot1 and Cboot2 are connected to pins HB and HS of first IC 502. In at least one example, first IC 502 and second IC 503 are separated to include two parallel connected boot capacitors Cboot1 and Cboot2. In at least one example, a single boot capacitor may replace two parallel connected boot capacitors Cboot1 and Cboot2. As discussed with reference to FIG. 2, a level-shifter and boot-strap transistor (or diode) of second IC 503 is unused (as indicated by dashed region 530) when second IC 503 is being used as a high-side switch of a half-bridge driver. In at least one example, passive device 505 is similar to passive device 204. No external level-shifter may be used for the half-bridge driver of system 500, in accordance with at least one example.

Figure 6:
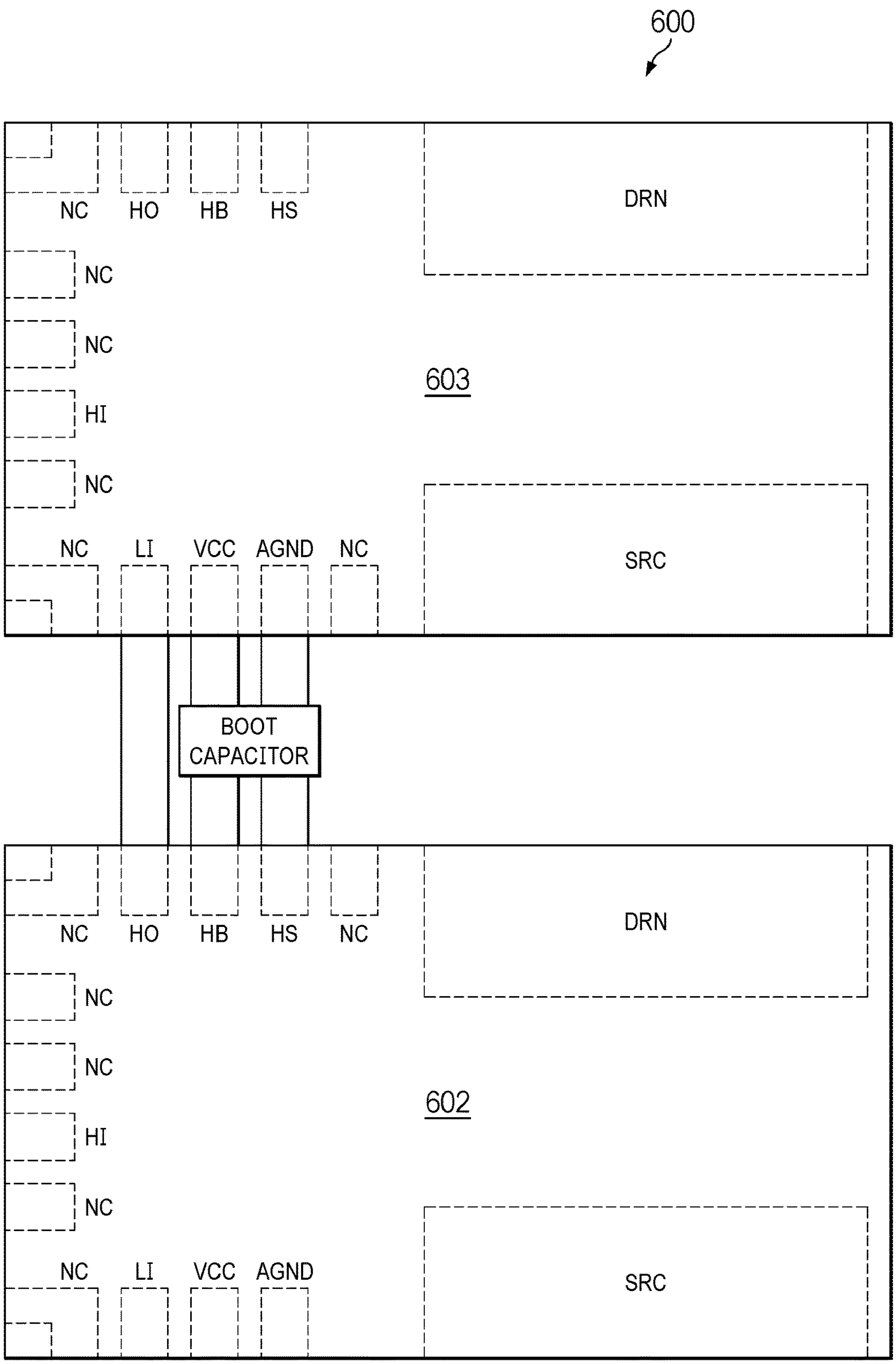
FIG. 6 illustrates a high-level system with layout of integrated circuits for a half-bridge driver on a printed circuitry board, according to at least one example.

FIG. 6 illustrates high-level system 600 with layout of half-bridge driver integrated circuits on a printed circuitry board, according to at least one example. In at least one example, system 600 comprises first IC 602 (e.g., first IC 102, 202, 302, 402, or 502) and second IC 603 (e.g., second IC 203). In at least one example, second IC 603 may be identical to first IC 602. In at least one example, first IC 602 and second IC 603 have identical area, perimeter, size, shape, height, pin types, and pin locations. In at least one example, high-level system 600 provides pin locations for first IC 602 that reduces routing between pins of first IC 602 and second IC 603. Other examples of pin locations may be used that result in closer proximity of first IC 602 and second IC 603 to reduce loop inductance between first IC 602 and second IC 603. Here, source (SRC) and drain (DRN) are shown to indicate source and drain area used by GaN FET in each IC. In at least one example, concatenation of first IC 602 and second IC 603 forms a half-bridge driver with no isolated well or tank, lower common source inductance and gate loop inductance, and thus higher performance than fully integrated half-bridge driver ICs.

Figure 7:
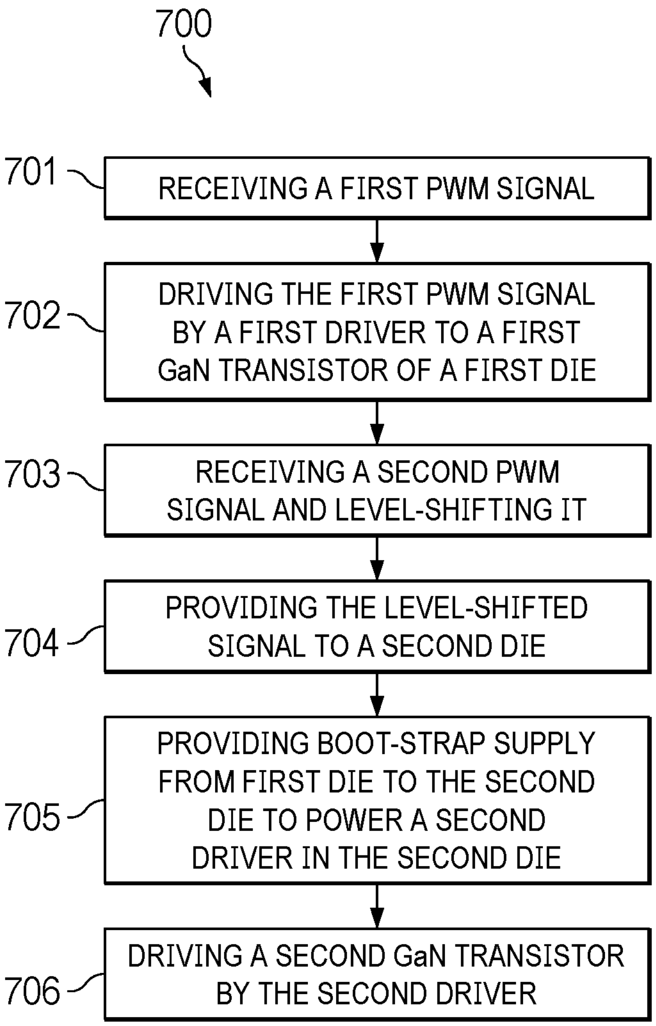
FIG. 7 illustrates a flowchart showing the operation of integrated circuits for a half-bridge driver, in accordance with at least one example.

FIG. 7 illustrates flowchart 700 showing operation of half-bridge driver integrated circuits, in accordance with at least one example. While various operation blocks are shown in a particular order, the order can be modified. For example, one or more operations can be performed in parallel or out of order.

In at least one example, at operation block 701, first IC (e.g., first IC 102, 202, 302, 402, 502, or 602) receives a first pulse modulated signal (e.g., PWMLI) from a pulse width modulator controller (e.g., PWM controller IC 101). In at least one example, at operation block 702, a driver of first IC (e.g., driver 222, 322, or 422) drives first pulse modulated signal to a first GaN transistor of first IC, where first IC is formed on a first semiconductor die.

In at least one example, at operation block 703, the first IC receives a second pulse modulated signal (e.g., PWMHI) from the pulse width modulator controller (e.g., PWM controller IC 101). In at least one example, the level-shifter of the first IC (e.g., level-shifter 224, 324, or 424) level-shifts a second pulse modulated signal to generate a level-shifted second pulse modulated signal. In at least one example, at operation block 704, the first IC provides a level-shifted second pulse modulated signal to a second driver (e.g., 226) of a second IC (e.g., second IC 203) via pin HO. In at least one example, the second IC is formed on a second semiconductor die.

In at least one example, at operation block 705, the first IC provides a boot-strap supply on pin HB from the first die to the second die to power the second driver (e.g., driver 226). In at least one example, at operation block 706, the second driver (e.g., driver 226) drives the second GaN transistor (e.g., GaN FET MLS2). In at least one example, the method of providing boot-strap supply comprises turning on a boot-strap transistor (e.g., transistor Msb1) to charge a capacitor (e.g., Cboot1) coupled to the first die and the second die based on an ON condition of first GaN transistor (e.g., GaN FET MLS1) and an OFF condition of second GaN transistor (e.g., GaN FET MLS2).

In at least one example, an operation is performed where the boot-strap transistor is turned OFF based on an OFF condition of the first GaN transistor and an ON condition of the second GaN transistor. In at least one example, the first die has a first perimeter, a first size, and a first shape. In at least one example, the second die has a second perimeter, a second size, and a second shape. In at least one example, the first perimeter is equal to the second perimeter, the first size is equal to the second size, and the first shape is the same as the second shape as indicated by FIGS. 5-6.

Following are additional examples provided in view of the above-described implementations. Here, one or more features of example, in isolation or in combination, can be combined with one or more features of one or more other examples to form further examples also falling within the scope of the disclosure. As such, one implementation can be combined with one or more other implementation without changing the scope of disclosure.

Example 1 is an integrated circuit, comprising: a transistor; and a driver coupled to a gate of the transistor, wherein the driver controls an operation of the transistor, wherein the driver is operable in a first configuration as a low-side gate driver for a voltage regulator, wherein the transistor is operable in the first configuration as a low-side switch for the voltage regulator, wherein the driver is operable in a second configuration as a high-side gate driver for the voltage regulator, and wherein the transistor is operable in the second configuration as a high-side switch for the voltage regulator.

Example 2 is an integrated circuit of any example herein, particularly example 1, wherein the transistor comprises Ga and N.

Example 3 is an integrated circuit of any example herein, particularly example 1, wherein the integrated circuit is a first integrated circuit, wherein the transistor is a first transistor, wherein the first integrated circuit further comprises a second transistor to receive a first power supply and to provide a second power supply to a second integrated circuit separate from the first integrated circuit.

Example 4 is an integrated circuit of any example herein, particularly example 3, wherein the first integrated circuit further comprises a level-shifter circuitry to provide an input to the second integrated circuit.

Example 5 is an integrated circuit of any example herein, particularly example 4, wherein the second integrated circuit further comprises a third transistor to receive the input, and wherein the third transistor comprises Ga and N.

Example 6 is an integrated circuit of any example herein, particularly example 5, wherein the first transistor has a first size, wherein the third transistor has a third size, and wherein the first size is same as the third size.

Example 7 is an integrated circuit of any example herein, particularly example 5, wherein the first transistor has a first size, wherein the third transistor has a third size, and wherein the first size is different from the third size.

Example 8 is an integrated circuit of any example herein, particularly example 4, wherein the level-shifter circuitry is a first level-shifter circuitry, wherein the second integrated circuit comprises a second level-shifter circuitry, and wherein the second level-shifter circuitry is disabled.

Example 9 is a system comprising: a controller circuitry to generate a pulse width modulated signal; a first integrated circuit coupled to the controller circuitry, wherein the first integrated circuit receives the pulse width modulated signal; a second integrated circuit coupled to the first integrated circuit; an inductor coupled to the first integrated circuit; a capacitor coupled to the inductor; and a load coupled to the capacitor and the inductor, wherein the first integrated circuit comprises a first transistor including GaN, wherein the first integrated circuit comprises a first driver that drives the first transistor in accordance with the pulse width modulated signal, wherein the second integrated circuit comprises a second transistor including GaN, and wherein the second integrated circuit comprises a second driver that receives a level-shifted signal from the first integrated circuit.

Example 10 is a system of any example herein, particularly example 9, wherein the second transistor is coupled to an input power supply.

Example 11 is a system of any example herein, particularly example 9, wherein the first transistor is operable as a low-side switch, and wherein the second transistor is operable as a high-side switch.

Example 12 is a system of any example herein, particularly example 9, wherein the first integrated circuit is on a first die, and wherein the second integrated circuit is on a second die.

Example 13 is a system of any example herein, particularly example 12, wherein the first die is adjacent to the second die on a same printed circuit board.

Example 14 is a system of any example herein, particularly example 12, wherein the first die has a first perimeter, a first size, and a first shape, wherein the second die has a second perimeter, a second size, and a second shape, wherein the first perimeter is equal to the second perimeter, wherein the first size is equal to the second size, and wherein the first shape is same as the second shape.

Example 15 is a system of any example herein, particularly example 9, wherein the first integrated circuit further comprises a third transistor to receive a first power supply and to provide a second power supply to the second driver of the second integrated circuit.

Example 16 is a system of any example herein, particularly example 9, wherein the first integrated circuit further comprises a level-shifter circuitry to provide the level-shifted signal to the second driver of the second integrated circuit.

Example 17 is a method comprising receiving a first pulse modulated signal; driving the first pulse modulated signal to a first GaN transistor of a first die; receiving a second pulse modulated signal; level-shifting the second pulse modulated signal to generate a level-shifted second pulse modulated signal; providing the level-shifted second pulse modulated signal to a second driver of a second die; and providing a boot-strap supply from the first die to the second die to power the second driver, wherein the second driver is to drive a second GaN transistor.

Example 18 is a method of any example herein, particularly example 17, wherein providing the boot-strap supply comprises turning on a boot-strap transistor to charge a capacitor coupled to the first die and the second die based on an on condition of the first GaN transistor and an off condition of the second GaN transistor.

Example 19 is a method of any example herein, particularly example 18, further comprising turning off the boot-strap transistor based on an off condition of the first GaN transistor and an on condition of the second GaN transistor.

Example 20 is a method of any example herein, particularly example 17, wherein the first die has a first perimeter, a first size, and a first shape, wherein the second die has a second perimeter, a second size, and a second shape, wherein the first perimeter is equal to the second perimeter, wherein the first size is equal to the second size, and wherein the first shape is same as the second shape.

Besides what is described herein, various modifications can be made to disclose implementations and implementations thereof without departing from their scope. Therefore, illustrations of implementations herein should be construed as examples, and not restrictive to scope of present disclosure.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

What is claimed is:

1. An apparatus comprising:

an integrated circuit having a first current terminal, a second current terminal, a first input, a second input, and an output, the integrated circuit including:
- a transistor having a control terminal and coupled between the first and second current terminals;
- a driver coupled between the first input and the control terminal; and
- a level shifter coupled between the second input and the output.

2. The apparatus of claim 1, wherein the transistor includes a gallium nitride (GaN) transistor.

3. The apparatus of claim 1, wherein the integrated circuit has a first supply terminal and a bias terminal, the driver has a second supply terminal coupled to the first supply terminal, the transistor is a first transistor, and the integrated circuit further comprises at least one of a diode or a second transistor coupled between the first supply terminal and the bias terminal.

4. The apparatus of claim 3, wherein the driver has a reference terminal coupled to the second current terminal.

5. The apparatus of claim 1, wherein the integrated circuit is a first integrated circuit, the transistor is a first transistor, the control terminal is a first control terminal, the driver is a first driver, and the apparatus further comprises a second integrated circuit having a third current terminal, a fourth current terminal, a third input, a third power supply terminal, and a second output, the second integrated circuit including:

a second transistor having a second control terminal and coupled between the third and fourth current terminals; and a second driver coupled between the third input and the second control terminal, the second driver having a fourth power supply terminal coupled to the third power supply terminal; and wherein the output of the first integrated circuit is coupled to the third input of the second integrated circuit, and the second current terminal is coupled to the third current terminal, and a bias terminal of the first integrated circuit is coupled to the third power supply terminal.

6. The apparatus of claim 5, wherein the first and second transistors have different sizes.

7. The apparatus of claim 5, wherein the first and second transistors have a same size.

8. The apparatus of claim 5, wherein the first and second integrated circuits are two instances of a same integrated circuit design.

9. The apparatus of claim 5, further comprising a capacitor coupled between the bias terminal and the first current terminal.

10. The apparatus of claim 5, further comprising an inductor coupled between the first and fourth current terminals and a power output, and the third current terminal is coupled to a power input.

11. The apparatus of claim 5, further comprising an inductor coupled between the first and third current terminals and a power input, and the fourth current terminal is coupled to a power output.

12. An apparatus comprising:

an integrated circuit having a first current terminal, a second current terminal, an input, a first power supply terminal, and a bias terminal, the integrated circuit including:

a first transistor having a control terminal and coupled between the first and second current terminals;

a driver coupled between the input and the control terminal, the driver having a second power supply terminal coupled to the first power supply terminal; and a second transistor or a diode coupled between the first power supply terminal and the bias terminal.

13. The apparatus of claim 12, wherein the first transistor includes a GaN transistor.

14. The apparatus of claim 12, wherein the input is a first input, and the integrated circuit has a second input and an output, and the integrated circuit includes a level shifter coupled between the second input and the output.

15. The apparatus of claim 14, wherein the integrated circuit is a first integrated circuit, the control terminal is a first control terminal, the driver is a first driver, and the apparatus further comprises a second integrated circuit having a third current terminal, a fourth current terminal, a third input, a third power supply terminal, and a second output, the integrated circuit including:

a third transistor having a second control terminal and coupled between the third and fourth current terminals; and a second driver coupled between the third input and the second control terminal, the second driver having a fourth power supply terminal coupled to the third power supply terminal; and wherein the output of the first integrated circuit is coupled to the third input of the second integrated circuit, the second current terminal is coupled to the third current terminal, and the bias terminal of the first integrated circuit is coupled to the third power supply terminal.

16. The apparatus of claim 15, wherein the first and third transistors have different sizes.

17. The apparatus of claim 15, wherein the first and second transistors have a same size.

18. The apparatus of claim 15, wherein the first and second integrated circuits are two instances of a same integrated circuit design.

19. The apparatus of claim 15, further comprising a capacitor coupled between the bias terminal and the first current terminal.

20. The apparatus of claim 15, further comprising an inductor coupled between the first and fourth current terminals and a power output, and the third current terminal is coupled to a power input.

21. The apparatus of claim 15, further comprising an inductor coupled between the first and third current terminals and a power input, and the fourth current terminal is coupled to a power output.

22. An apparatus comprising:

an integrated circuit having a first current terminal, a second current terminal, a first input, a second input, an output, a first power supply terminal, and a bias terminal, the integrated circuit including:

a first transistor having a control terminal and coupled between the first and second current terminals;

a driver coupled between the first input and the control terminal, the driver having a second power supply terminal coupled to the first power supply terminal;

a second transistor or a diode coupled between the first power supply terminal and the bias terminal; and a level shifter coupled between the second input and the output.

23. The apparatus of claim 22, wherein the first transistor includes a GaN transistor.

* * * * *